US009500684B1

(12) United States Patent
Pendergrass et al.

(10) Patent No.: US 9,500,684 B1
(45) Date of Patent: Nov. 22, 2016

(54) LINE-MOUNTED ELECTRICAL ENERGY MEASUREMENT DEVICE WITH INTEGRATED VOLTAGE PICKUP AND CLAMP

(71) Applicant: Sensorlink Corporation, Ferndale, WA (US)

(72) Inventors: Robert Pendergrass, Ferndale, WA (US); Nathanial Roth, Ferndale, WA (US); Scott Bretvick, Ferndale, WA (US); Zhijiang Guo, Ferndale, WA (US)

(73) Assignee: SENSORLINK CORPORATION, Ferndale, WA (US)

( * ) Notice: Subject to any disclaimer, the term of this patent is extended or adjusted under 35 U.S.C. 154(b) by 275 days.

(21) Appl. No.: 14/463,555

(22) Filed: Aug. 19, 2014

Related U.S. Application Data

(60) Provisional application No. 61/867,507, filed on Aug. 19, 2013.

(51) Int. Cl.

| | |
|---|---|
| ***H01R 4/24*** | (2006.01) |
| ***G01R 21/00*** | (2006.01) |
| ***G01R 31/40*** | (2014.01) |
| ***H01R 4/26*** | (2006.01) |
| *H01R 4/42* | (2006.01) |

(52) U.S. Cl.
CPC ............... *G01R 21/00* (2013.01); *G01R 31/40* (2013.01); *H01R 4/26* (2013.01); *H01R 4/2408* (2013.01); *H01R 4/2433* (2013.01); *H01R 4/42* (2013.01)

(58) Field of Classification Search
USPC .................................................. 439/411, 412
See application file for complete search history.

(56) References Cited

U.S. PATENT DOCUMENTS

| | | | | |
|---|---|---|---|---|
| 3,253,215 A | | 5/1966 | Moakler et al. | |
| 3,386,032 A | | 5/1968 | Medlar | |
| 4,258,348 A | | 3/1981 | Belfer et al. | |
| 4,456,873 A | | 6/1984 | Schweitzer | |
| 4,620,151 A | | 10/1986 | Landre | |
| 4,684,196 A | * | 8/1987 | Smith .................. | H01R 4/2408 439/411 |
| 4,717,872 A | | 1/1988 | Wagner et al. | |
| 4,839,600 A | | 6/1989 | Kuurstra | |
| 5,015,198 A | * | 5/1991 | Delin ....................... | H01R 4/44 439/411 |
| 5,206,777 A | * | 4/1993 | Clarey ................. | H01R 4/2408 361/103 |
| 5,426,360 A | | 6/1995 | Maraio et al. | |
| 6,624,622 B2 | | 9/2003 | Noh | |
| 6,825,650 B1 | | 11/2004 | McCormack et al. | |
| 7,412,338 B2 | | 8/2008 | Wynans et al. | |
| 7,940,039 B2 | | 5/2011 | Buda | |
| 8,744,788 B2 | | 6/2014 | Sala | |

FOREIGN PATENT DOCUMENTS

| | | |
|---|---|---|
| JP | 9029533 A | 4/1997 |

* cited by examiner

*Primary Examiner* — Tho D Ta
(74) *Attorney, Agent, or Firm* — Michael R. Schacht; Schacht Law Office, Inc.

(57) ABSTRACT

A tap assembly for a measurement device has a clamp base, a main assembly, a piercing member, a clamp member defining an anchor surface, and a bolt member defining a shaft portion and a head portion. The clamp base has a brace portion defining a bolt opening. The piercing member is supported by a contact plate of the main assembly. The clamp base is attached to the main assembly to define a clamp notch. The contact plate is adjacent to the clamp notch. The shaft portion of the bolt member extends through the bolt opening and engages the anchor surface. At least a portion of the conductor is arranged within the clamp notch between the clamp member and the piercing member such that axial rotation of the bolt member displaces the clamp member towards the piercing member to cause the piercing member to engage the conductor.

19 Claims, 14 Drawing Sheets

LINE-MOUNTED ELECTRICAL ENERGY MEASUREMENT DEVICE WITH INTEGRATED VOLTAGE PICKUP AND CLAMP

RELATED APPLICATIONS

This application claims benefit of U.S. Provisional Application Ser. No. 61/867,507 filed Aug. 19, 2013, the contents of which are incorporated herein by reference.

TECHNICAL FIELD

The present invention relates to energy measurement systems and methods and, in particular, to systems and methods that facilitate the measurement of parameters and recording of data associated with secondary voltage systems.

BACKGROUND

Utility companies operate extensive networks of power distribution equipment connected by power lines. The power distribution equipment and power lines are often located in remote locations, and it is not feasible to continuously monitor such distribution equipment and power lines.

In particular, the power distribution equipment typically includes transformers located throughout an electrical distribution system (grid) as required by the loads serviced by the electrical distribution system. To allow the electrical distribution system to operate efficiently, the transformers forming a part of the electrical distribution system should be efficiently loaded. Factors such as power theft may result in inefficient loading of transformers and thus inefficient operation of the electrical distribution system.

The need thus exists for energy measurement systems for secondary voltage systems that facilitate the efficient operation of power distribution equipment such as transformers forming a part of an electrical distribution system.

SUMMARY

The present invention may be embodied as a measurement device for generating measurement data associated with at least first and second conductors of an electrical distribution system comprising at least first and second tap assemblies and at least one cable. The first and second tap assemblies each comprising a clamp assembly comprising a brace defining a bolt opening, a piercing member supported relative to the brace, a clamp member defining an anchor surface, and a bolt member defining a shaft portion and a head portion. The shaft portion of the bolt member extends through the bolt opening and engages the anchor surface such that axial rotation of the bolt member displaces the clamp member towards and away from the piercing member. The at least one cable operatively connects the first and second tap assemblies. At least portions of the first and second conductors are arranged between the clamp member and the piercing member of the first and second tap assemblies, respectively. Accordingly, displacement of the clamp member of the first tap assembly towards the piercing member of the first tap assembly causes the piercing member of the first tap assembly to engage the first conductor. Similarly, displacement of the clamp member of the second tap assembly towards the piercing member of the second tap assembly causes the piercing member of the second tap assembly to engage the second conductor.

The present invention may also be embodied as a tap assembly for a measurement device for generating measurement data associated with at least one conductor of an electrical distribution system comprising a clamp base, a main assembly, a piercing member, a clamp member, and a bolt member. The clamp base comprises a brace portion defining a bolt opening. The main assembly comprises a contact plate. The piercing member is supported by the contact plate. The clamp member defines an anchor surface. The bolt member defines a shaft portion and a head portion. The clamp base is attached to the main assembly to define a clamp notch, where the contact plate is adjacent to the clamp notch. The shaft portion of the bolt member extends through the bolt opening and engages the anchor surface such that axial rotation of the bolt member displaces the clamp member towards and away from the piercing member. At least a portion of the conductor is arranged within the clamp notch between the clamp member and the piercing member such that displacement of the clamp member towards the piercing member causes the piercing member to engage the conductor.

The present invention may be embodied as a method of generating measurement data associated with at least one conductor of an electrical distribution system comprising the following steps. A clamp base comprising a brace portion defining a bolt opening is provided. A main assembly comprising a contact plate is provided. A piercing member is supported on the contact plate. A clamp member defining an anchor surface is provided. A bolt member defining a shaft portion and a head portion is provided. The clamp base is attached to the main assembly to define a clamp notch, where the contact plate is adjacent to the clamp notch. The shaft portion of the bolt member is extended through the bolt opening. The shaft portion of the bolt member is engaged with the anchor surface. At least a portion of the conductor is arranged within the clamp notch between the clamp member and the piercing member. The bolt member is axially rotated to displace the clamp member towards the piercing member to cause the piercing member to engage the conductor.

DETAILED DESCRIPTION

Figure 1:
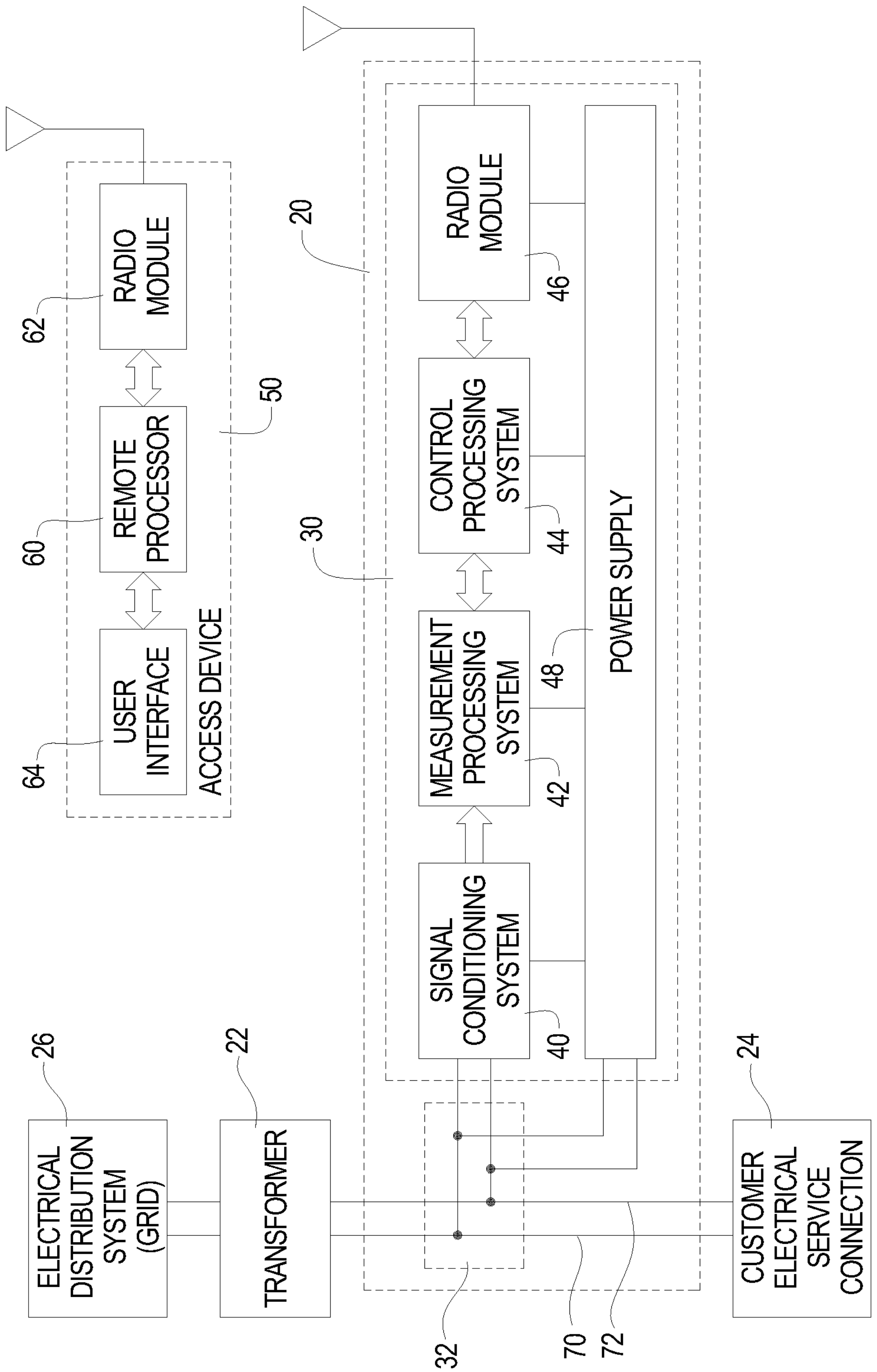
FIG. 1 is block diagram depicting an example of a first example measurement system of the present invention.

Referring initially to FIG. 1 of the drawing, depicted therein is a first example measurement system 20 constructed in accordance with, and embodying, the principles of the present invention. The example measurement system 20 is connected between a transformer 22 and a customer electrical service connection 24. The transformer 22 and customer electrical service connection 24 are in turn connected to, and form a part of, an electrical distribution system 26. The transformer 22, customer electrical service connection 24, and electrical distribution system 26 are or may be conventional and will not be described herein beyond that extent helpful for a complete understanding of the present invention.

The first example measurement system 20 comprises an electrical portion 30 and a mechanical portion 32. The example electrical portion 30 is a circuit board or module that generates measurement data associated with parameters of the electrical distribution system 26. The measurement data is typically converted to digital form and stored for subsequent downloading.

Figure 16A:
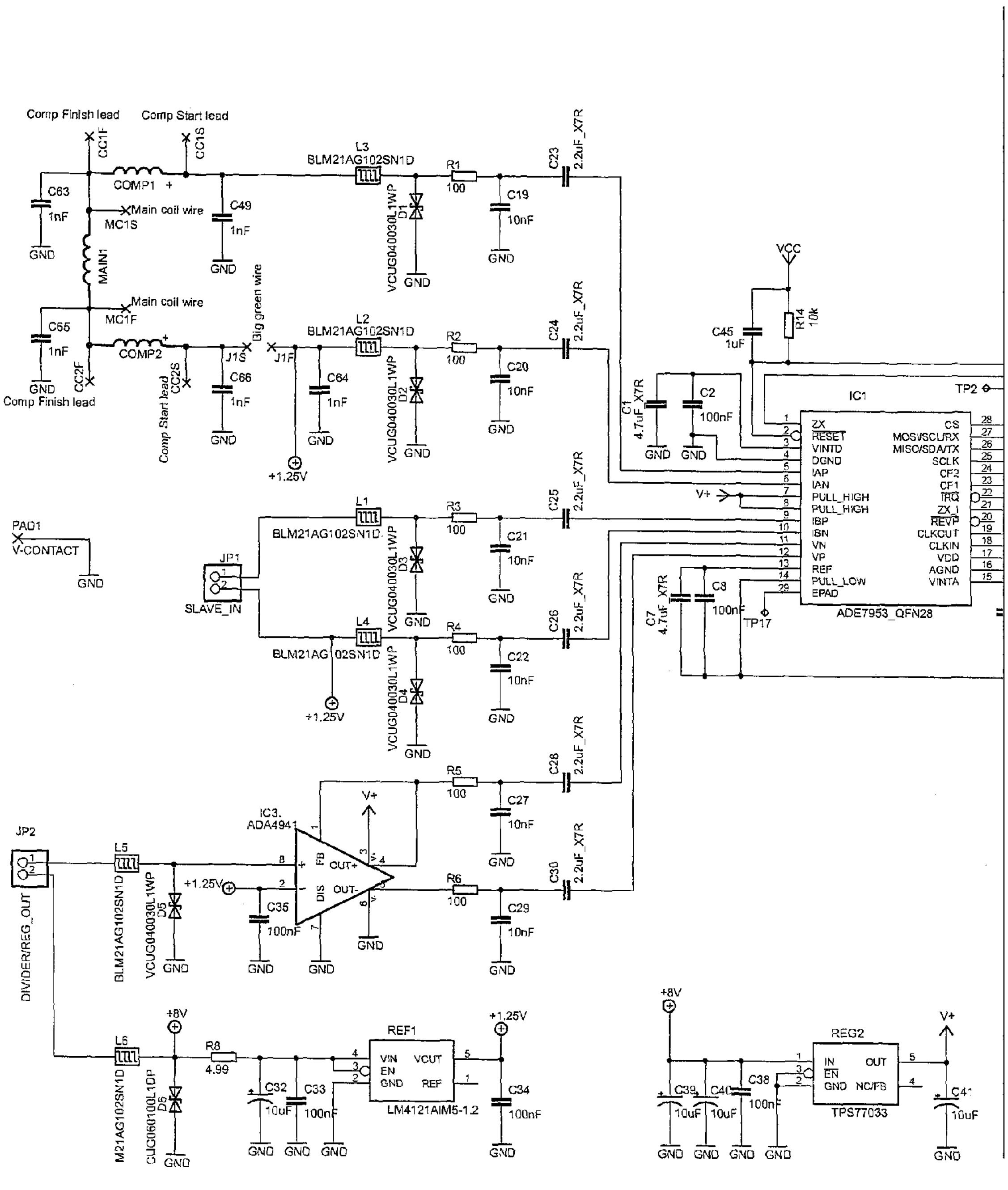
FIGS. 16A and 16B are a schematic diagram depicting one example of an electrical portion that may be used as part of the example measurement systems of the present invention.
Figure 16B:
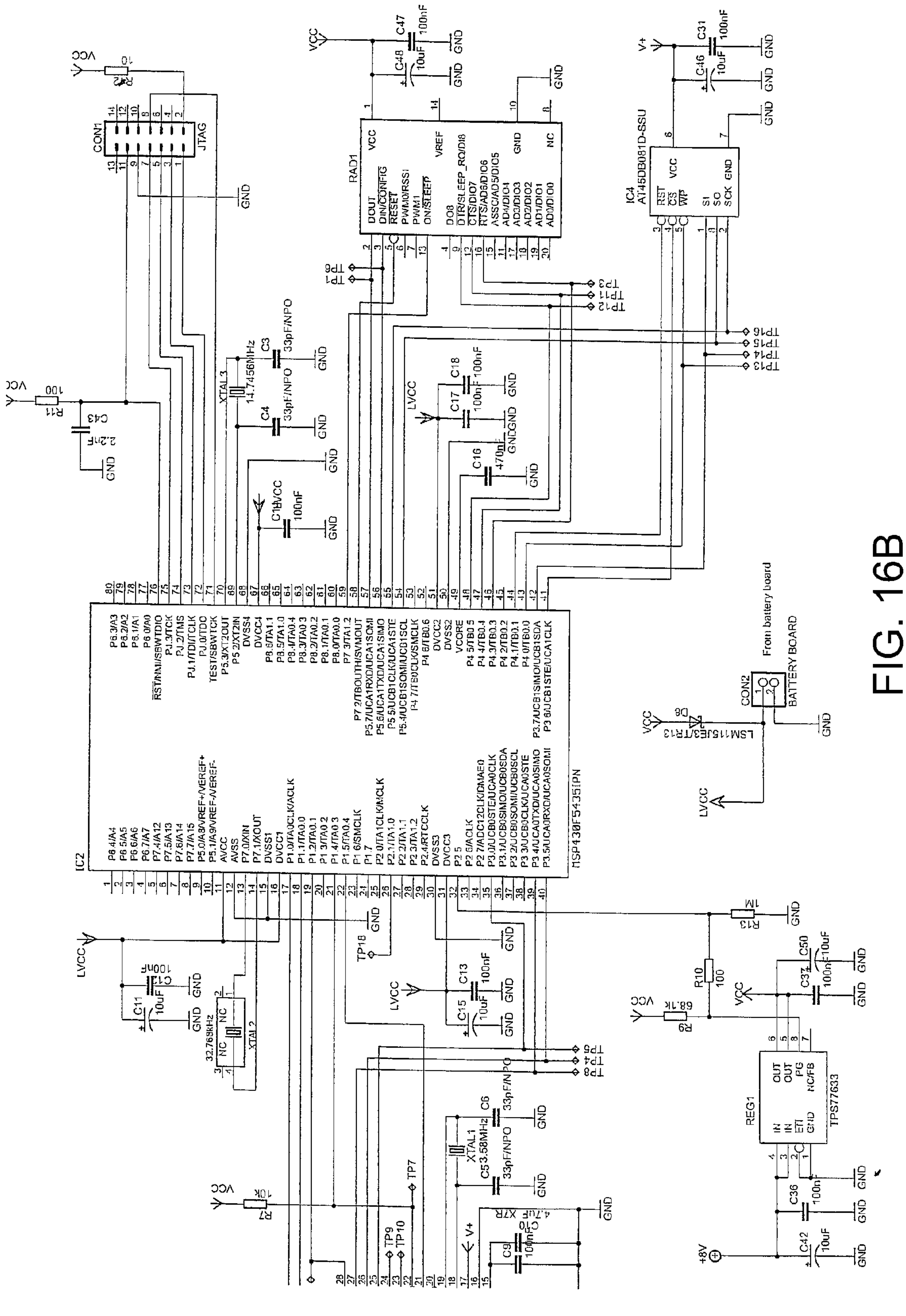

The example electrical portion 30 thus comprises components that form a signal conditioning system 40, a measurement processing system 42, a control processing system 44, a radio module 46, and a power supply 48. An example circuit diagram that may be used to implement the electrical portion 30 is depicted in FIGS. 16A and 16B.

The signal conditioning system 40 generates raw data based on analog signals associated with the electrical distribution system 26; the raw data is binary data suitable for processing and possibly storage by the measurement processing system 42. The control processing system 44 arranges the raw data as processed data and stores the processed data for subsequent downloading.

The control processing system 44 further runs an integrated software program incorporating the logic necessary to transmit the processed data to an access device 50 when directed. The control processing system 44 and the access device 50 communicate using the radio module 46, although the processed data may be directly downloaded from the control processing system 44 using an electrical connector (not shown) in a conventional fashion. The example access device 50 contains a remote processor 60, a radio module 62, and a user interface 64. The remote processor 60 runs a remote software program that cooperates with the integrated software program running on the control processing system 44 to transmit data between the example measurement system 20 and the access device 50.

The power supply 48 supplies electrical power to the signal conditioning system 40, measurement processing system 42, control processing system 44, and radio module 46 as will be described in further detail below.

FIG. 1 further illustrates that, as is or may be conventional, first and second conductors 70 and 72 extend between the transformer 22 and the customer electrical service connection 24 in the example electrical distribution system 26. The example mechanical portion 32 connects the electrical portion 30 to the first and second conductors 70 and 72 as will be explained in further detail below. The first and second conductors 70 and 72 employ, or may employ, the same physical structure as described in further detail below. In particular, as shown in FIG. 3, the first conductor 70 comprises a conductor portion 80 and an insulator portion 82, while the second conductor 72 comprises a conductor portion 90 and an insulator portion 92. The first conductor 70 is also shown in more detail in FIGS. 2, 4, 7, and 9.

Figure 2:
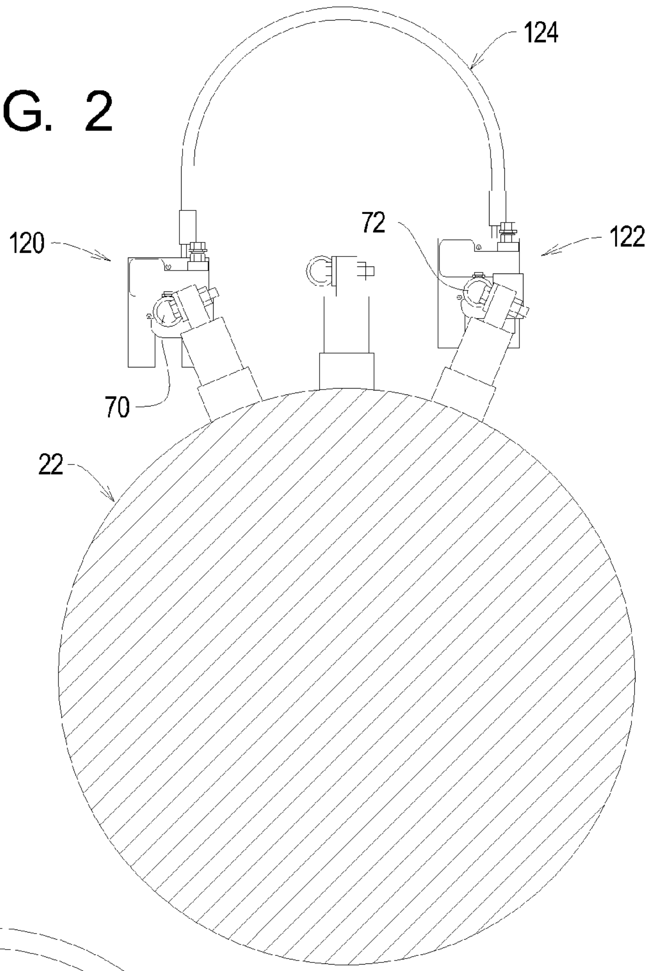
FIG. 2 is a top plan partial section view illustrating one example use of the first example measurement system with a first type of transformer.
Figure 3:
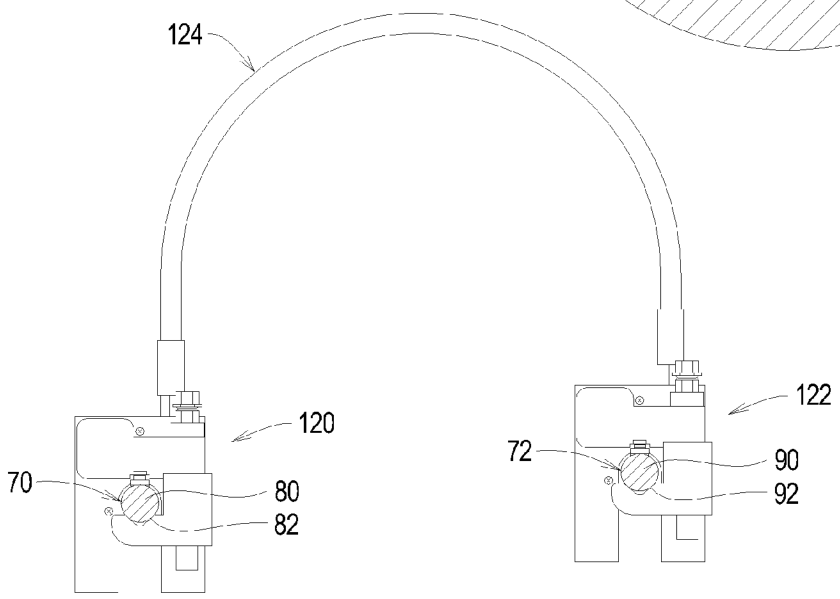
FIG. 3 is a top plan partial section view illustrating the engagement of the first example measurement system with first and second conductors of the transformer of FIG. 2.

The mechanical portion 32 of the first example measurement system 20 is depicted in further detail in FIGS. 2-13. FIGS. 2 and 3 illustrate that the example mechanical portion 32 comprises a first tap assembly 120, a second tap assembly 122, and a cable 124. FIGS. 2 and 3 further illustrate that the first and second tap assemblies 120 and 122 are connected to the first and second conductors 70 and 72, respectively.

The example tap assemblies 120 and 122 are or may be mechanically the same. The electrical portion 30 of the measurement system 20 is mounted in one or both of the tap assemblies 120 and 122. In particular, the example electrical portion 30 is mounted within the first tap assembly 120, and the cable 124 allows communication of analog signals from second tap assembly 122 to the electrical portion 30 mounted within the first tap assembly 120. As an alternative example, only the measurement processing system 42, control system 44, and radio module 46 may be mounted within the first tap assembly 120. In this case, the signal conditioning system 40 may be arranged partly within the first tap assembly 120 and partly within the second tap assembly 122. As yet another example, it may be possible to duplicate entire electrical portion 30 in each of the tap assemblies 120 and 122, in which case the duplicated electrical portions 30 may each communicate directly with the access device 50 and with each other using the radio modules.

Referring now to FIGS. 3-13, the example first tap assembly 120 will be described in further detail, with the understanding that the following discussion of the example first tap assembly 120 also applies to the second example tap assembly 122.

Figure 11:
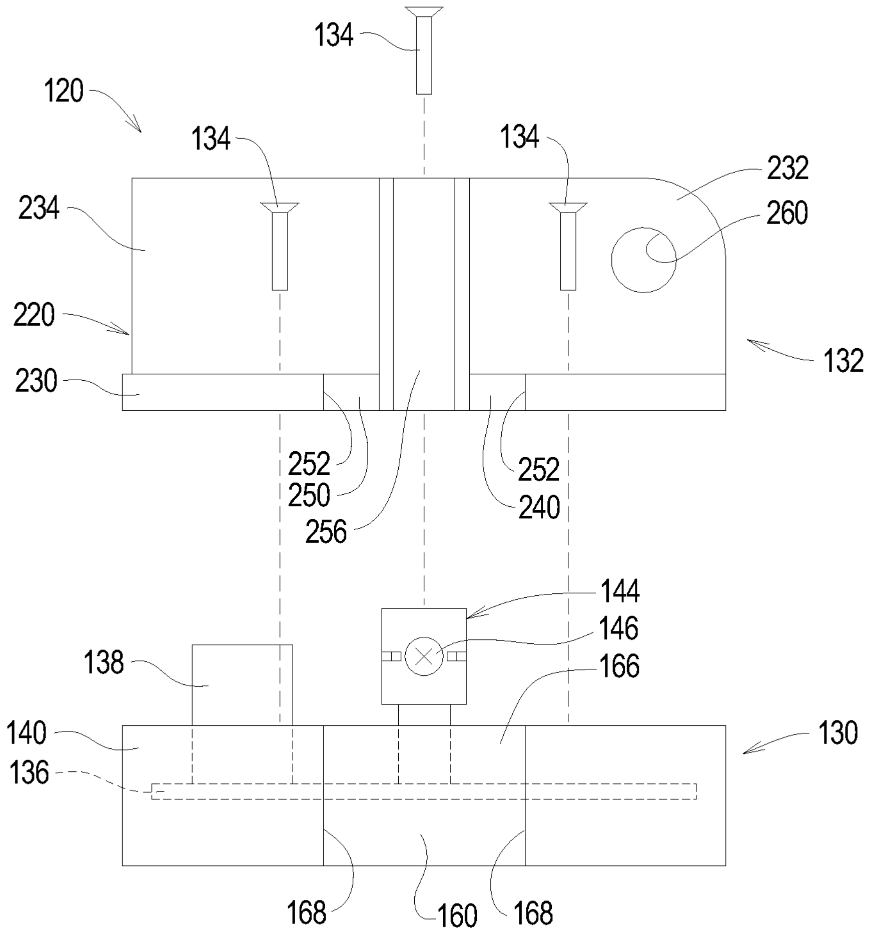
FIG. 11 is an exploded view of the tap assembly of the first example measurement system.
Figure 12:
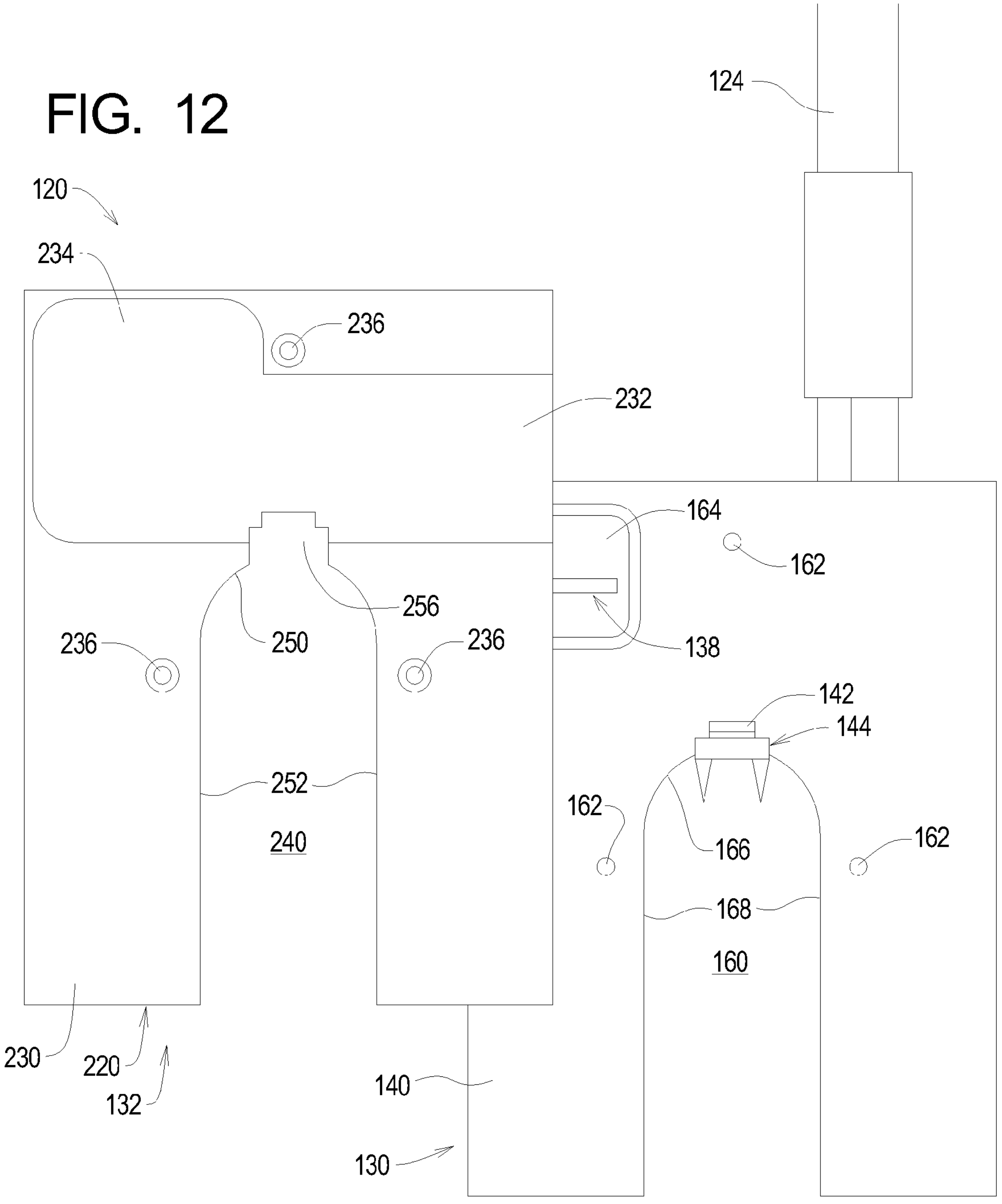
FIG. 12 is a top plan view illustrating a main assembly and a clamp assembly of the tap assembly of the first example measurement system.
Figure 13:
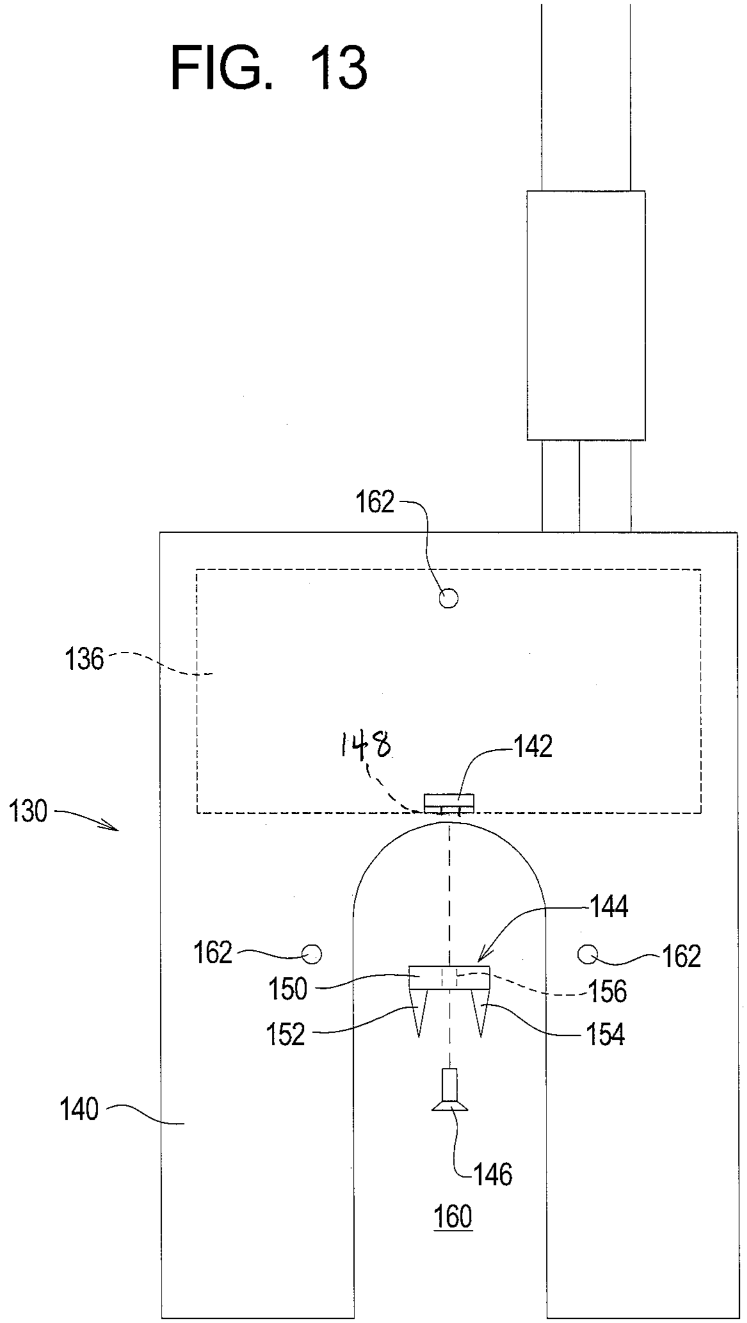
FIG. 13 is a top plan view illustrating the process of attaching the piercing member to the main assembly of the tap assembly of the first example measurement system.

As perhaps best shown in FIGS. 11 and 12, the example first tap assembly 120 comprises a main assembly 130, a clamp assembly 132, and at least one mounting screw 134. The example first tap assembly 120 comprises three of the mounting screws 134 as shown in FIG. 11. FIG. 12 further illustrates that the cable 124 is connected to the main assembly 130. In the first example measurement system 20, a main board 136 of electrical portion 30 is supported by the main assembly 130 as shown in FIGS. 11 and 13. FIGS. 11 and 12 further illustrate that a sister board 138 of the electrical portion 30 extends from the main assembly 130 in the example first tap assembly 120.

FIGS. 11-13 further illustrate that the main assembly 130 comprises a main housing 140, a contact plate 142, a piercing member 144, and a contact screw 146. The example contact plate 142 defines an attachment hole 148. The contact plate 142 is supported by the main housing 140 and is connected to, or forms a part of, the electrical portion 30 in the first example measurement system 20. The piercing member 144 comprises a base portion 150 and first and second piercing points 152 and 154. The base portion 150 defines an attachment opening 156. The contact screw 146 extends through the attachment opening 156 and into the contact plate to detachably attach the piercing member 144 to the contact plate 142.

The example main housing 140 is generally rectangular and defines a housing notch region 160 and, in the example first tap assembly 120, three mounting holes 162. The example main housing 140 further defines a sister board opening 164 through which the sister board 138 extends. When the piercing member 144 is attached to the contact plate 142, the piercing points 152 and 154 extend into the housing notch region 160 defined by the main housing 140 as shown in FIGS. 4-10.

FIGS. 4-10 further illustrate that the housing notch region 160 is bounded by an end wall 166 and opposing housing side walls 168. As will be described in further detail below, the example end wall 166 is generally shaped to correspond to an external surface of the conductor 70 and the opposing housing side walls 168 are spaced from each other to allow the conductor 70 to be arranged substantially adjacent to at least a portion of the end wall 166. Typically, the conductor 70 takes the form of a somewhat flexible cylindrical body having a circular cross-section. To accommodate such a typical conductor, the example end wall 166 is semi-circular, with a diameter of the circle defining the end wall 166 being slightly larger than a diameter of the conductor 170. Further, in this example the spacing between first and second housing side walls 168 is slightly greater than a diameter of the conductor 170.

Referring now to FIGS. 4-10 and 12, the example clamp assembly 132 will be described in further detail. The clamp assembly 132 comprises a clamp base 220, an engaging assembly 222, and a clamp bolt assembly 224. The clamp base 220 defines a base plate 230, a brace portion 232, and a cover portion 234. The base plate 230, brace portion 232, and cover portion 234 of the example clamp base 220 are integrally formed of plastic.

The base plate 230 defines a plate notch region 240, and, in the example tap assembly 120, three mounting openings 236 are formed in the base plate 230. The plate notch region 240 is bounded by an end wall 250 and opposing clamp side walls 252. As with the end wall 166 described above, the example end wall 250 is generally shaped to correspond to an external surface of the conductor 70. And like the opposing housing side walls 168, the clamp side walls 252 are spaced from each other to allow the conductor 70 to be arranged substantially adjacent to at least a portion of the end wall 166. The example end wall 166 is semi-circular to accommodate a typical conductor, with a diameter of the circle defining the end wall 166 being slightly larger than a diameter of the conductor 170. Like the housing side walls 168, the spacing between clamp side walls 252 is slightly greater than a diameter of the conductor 170. In addition, the end wall 250 defines a contact notch 256 as will be described in further detail below.

The brace portion 232 defines a bolt opening 260. The example bolt opening 260 is located on the opposite side of the contact notch 256 from the cover portion 234 in the example base plate 230.

The example engaging assembly 222 comprises a clamp member 270 defining an anchor opening 272 and an anchor insert 274 secured within at least a portion of the anchor opening 272. The anchor insert 274 is internally threaded. The clamp member 270 further defines a clamp surface 276 and a cover wall portion 278. The example clamp member 270 is integrally formed of plastic of sufficient rigidity to perform the clamping function as described herein. The example clamp surface 276 is textured and shaped with a concave V-shaped shape to guide the conductor 70 against the piercing member 144 as will be described in further detail below.

The example clamp bolt assembly 224 comprises a bolt member 280 and a bolt head 282. The example bolt member 280 is integrally formed of steel and defines a head portion 284 and a shaft portion 286. The shaft portion 286 is externally threaded. The bolt head 282 facilitates axial rotation of the bolt member 280 as described below.

The example bolt head 282 defines a base portion 290, a first drive portion 292, and a second drive portion 294. The base portion 290 defines a head chamber 296 sized and dimensioned to accommodate the bolt head portion 284. An optional relief portion 298 separates the first and second drive portions 292 and 294. The example bolt head 282 is integrally formed of plastic of sufficient rigidity to transfer rotational loads applied to the drive portions 292 and 294 to the base portion 290 and thus to the head portion 284 of the bolt member 280. The relief portion 298 may be used to prevent over-torqueing of the bolt head 282 by allowing the second drive portion 294 to break away from the first drive portion 292 when excessive torque is applied to the second drive portion 294.

Figure 4:
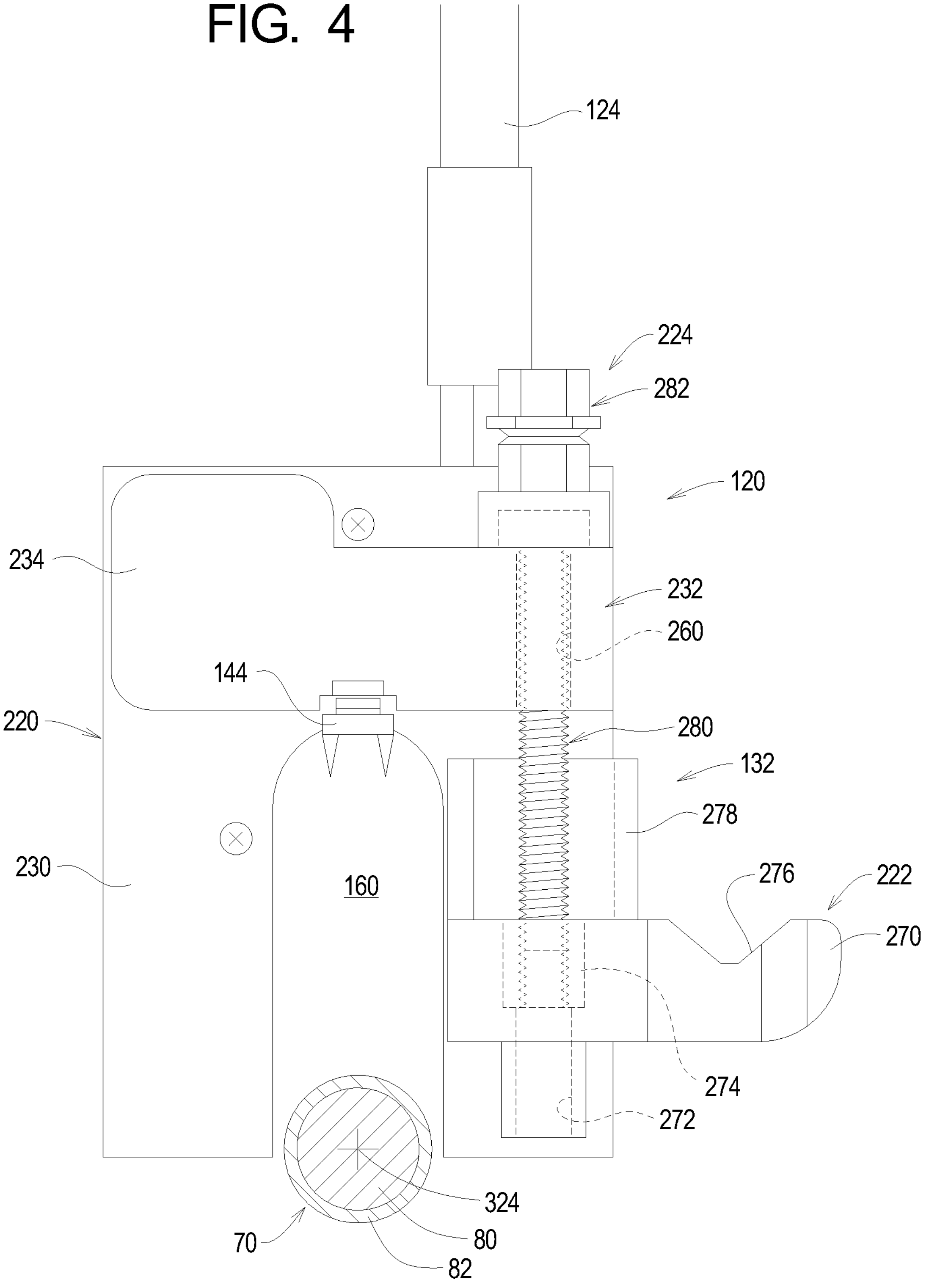
FIG. 4 is a top plan partial section view illustrating an initial step in the process of engaging a tap assembly of the first example measurement system with the first conductor depicted in FIG. 3.
Figure 5:
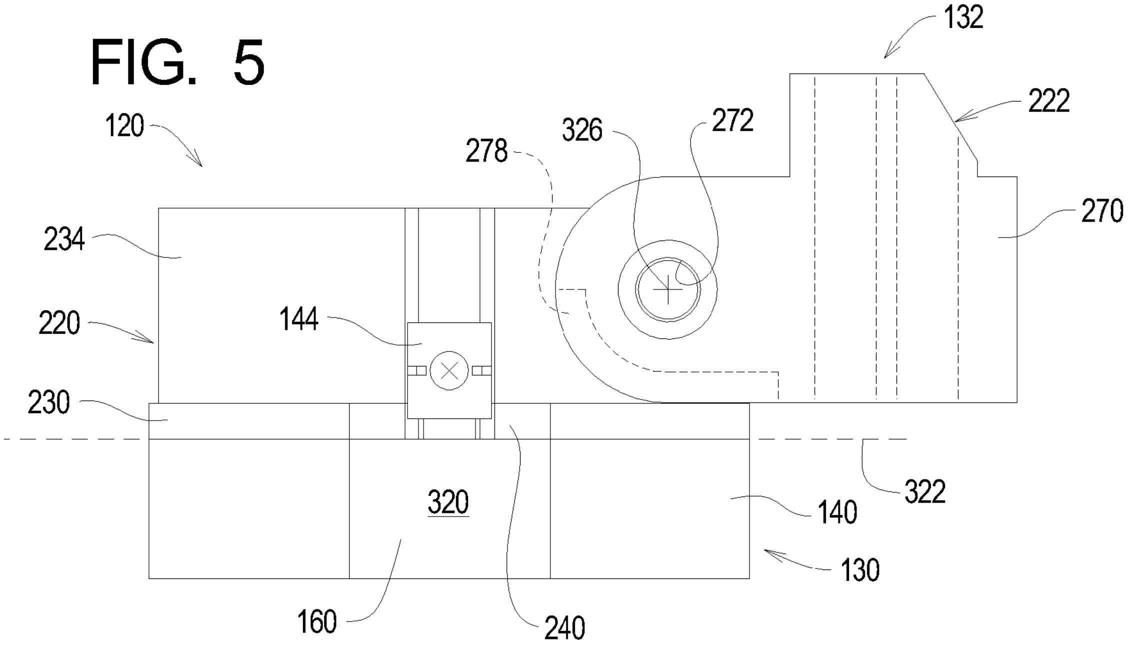
FIGS. 5 and 6 are front elevation views illustrating two positions of a clamp member of the first example measurement system.
Figure 7:
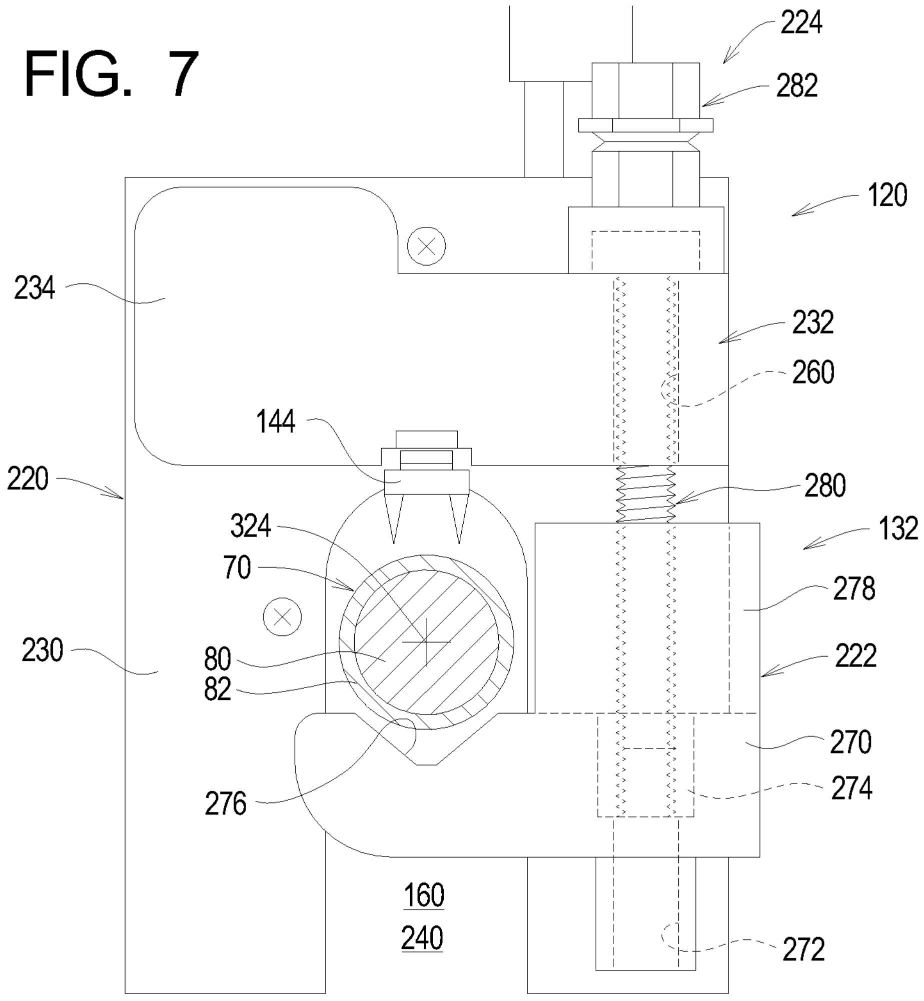
FIG. 7 is a top plan partial section view illustrating an intermediate step in the process of engaging a tap assembly of the first example measurement system with the first conductor depicted in FIG. 3.
Figure 8:
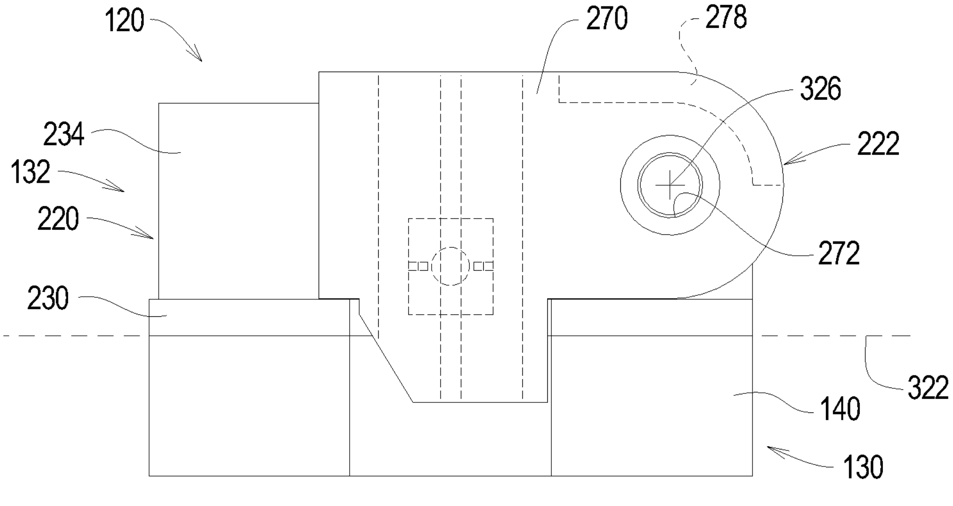
FIG. 8 is a front elevation view illustrating a closed position of the clamp member of the first example measurement system.
Figure 9:
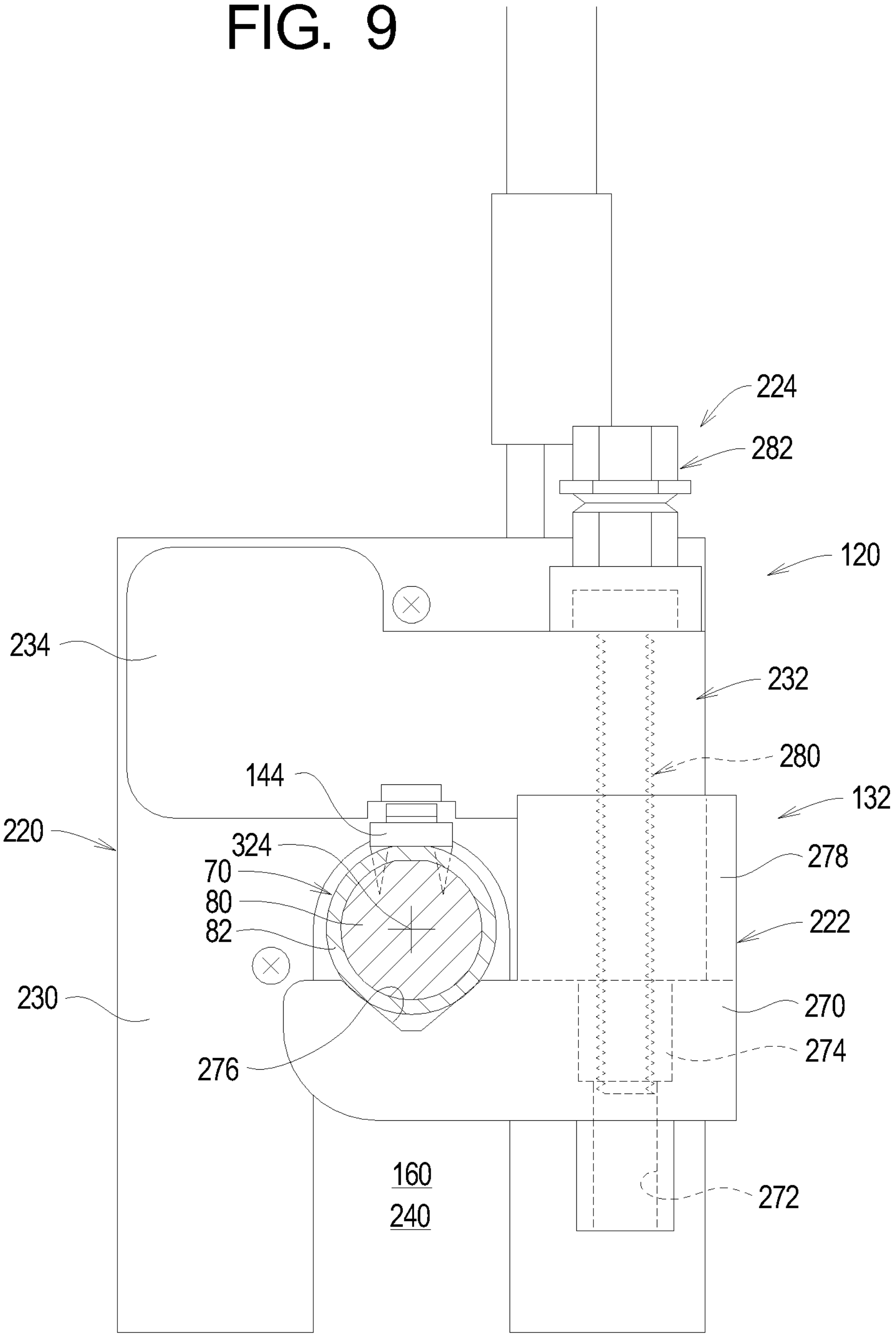
FIG. 9 is a top plan partial section view illustrating a final step in the process of engaging a tap assembly of the first example measurement system with the first conductor depicted in FIG. 3.
Figure 10:
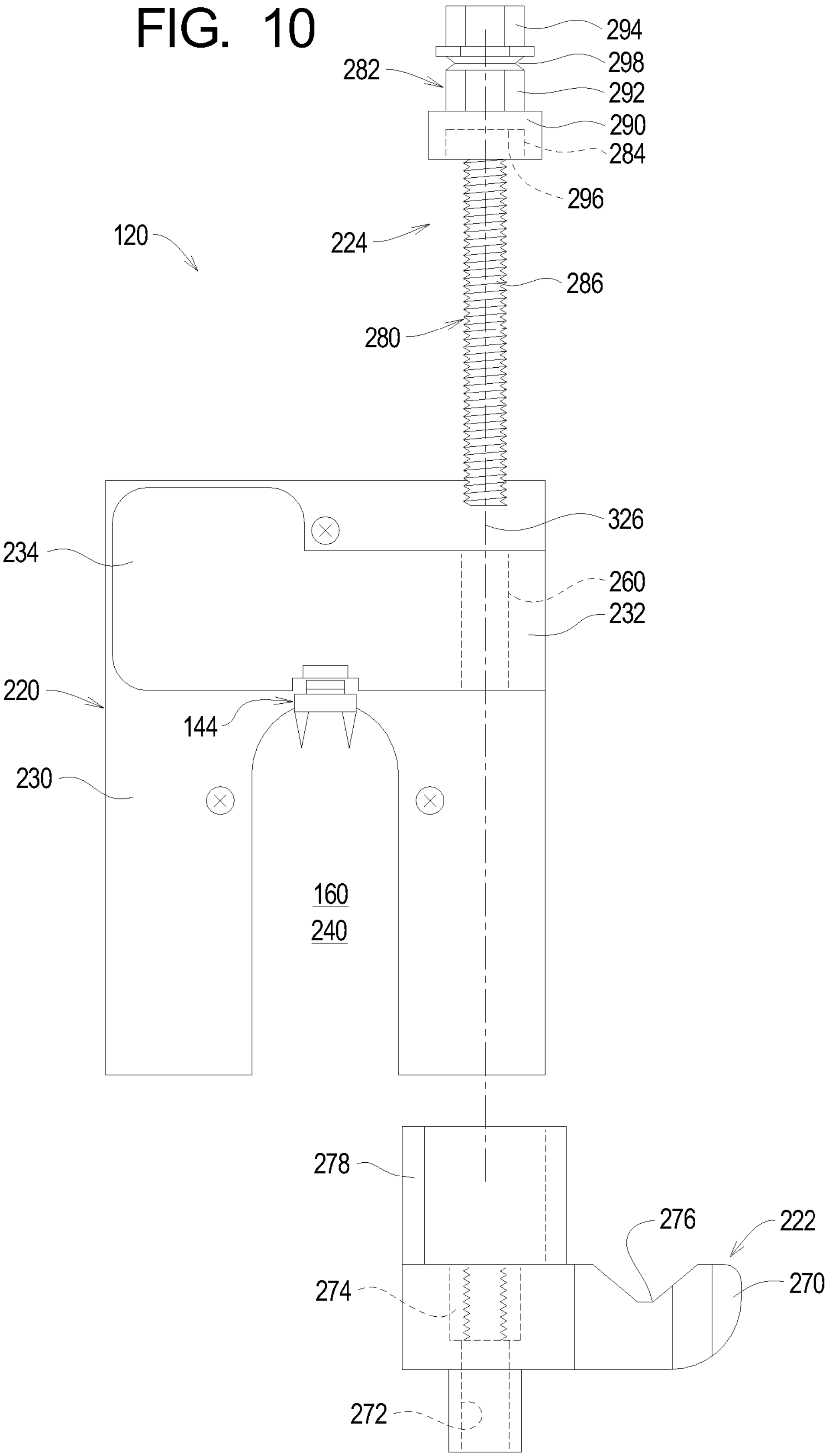
FIG. 10 is an exploded view of a tap assembly of the first example measurement system.

To assemble the clamp assembly 132, the shaft portion 286 of the bolt member 280 is inserted through the bolt opening 260 and at least partly into the threaded anchor insert 274. The bolt opening 260 is oversized to allow free axial rotation of the shaft portion 286 relative to the brace portion 232. However, the example bolt opening 260 is smaller than the head portion 284 of the bolt member 280 and/or the bolt head 282. The clamp member 270 may thus rotate between an open position as shown in FIGS. 4 and 5 and a closed position as shown in FIGS. 7-9. The anchor insert 274 defines an internally threaded anchor surface that engages the bolt shaft portion 286 such that axial rotation of the bolt member 280 engages the anchor insert 274 to displace the clamp member 270 towards and away from the brace portion 232 between a clamped position as shown in FIG. 9 and an unclamped position as shown in FIG. 7. The anchor surface may be defined by the anchor insert 274 or, optionally, by the clamp member 270.

With the clamp assembly so formed, the three mounting screws 134 are passed through the mounting openings 236 and threaded into the mounting holes 162 to secure the clamp base 220 to the main housing 140. With the clamp base 220 secured to the main housing 140, the plate notch region 240 defined by the base plate 230 substantially corresponds to the dimensions of the housing notch region 160 described above. The plate notch region 240 and housing notch region 160 define a clamp region 320 when the clamp base 220 is secured to the main housing 140. In addition, the contact notch 256 defined by the end wall 250 is sized and dimensioned to accommodate the contact plate 142 and the piercing member 144 as perhaps best shown in FIGS. 4, 7, and 11. With the clamp base 220 secured to the main housing 140, the contact plate 142 is arranged such that the attachment hole 148 formed therein faces the clamp region 320 and is accessible from the clamp region 320. The attachment screw 146 thus may be removed without disassembling the clamp base 220 from the main housing 140. The accessibility of the attachment screw 146 thus allows removal and replacement of the piercing member 144 by the end user in the field if necessary. Further, the cover portion 234 of the clamp base 220 covers the sister board opening 164 and sister board 138 when the clamp base 220 is secured to the main housing 140.

To use the example first tap assembly 120, the clamp member 270 is arranged in the unclamped and open configurations as shown in FIGS. 4 and 5. In particular, the bolt member 280 is axially rotated such that the clamp member 270 is displaced away from the brace portion 232, and the clamp member 270 is rotated into the open position such that access to the clamp notch 320 is substantially unobstructed.

The conductor 70 is next arranged such that the conductor 70 is within the clamp notch 320. In particular, the clamp region 320 defines a clamping plane 322 as perhaps best shown in FIGS. 5, 6, and 8. The conductor 70 defines a conductor axis 324 as shown in FIGS. 4, 7, and 9. In addition, the clamp bolt member 280 defines a bolt axis 326 that is spaced from and parallel to the clamping plane 322. When the conductor 70 is arranged within the clamp notch 320, the conductor axis 324 is substantially orthogonal to the clamping plane 322 and to the bolt axis 326.

Figure 6:
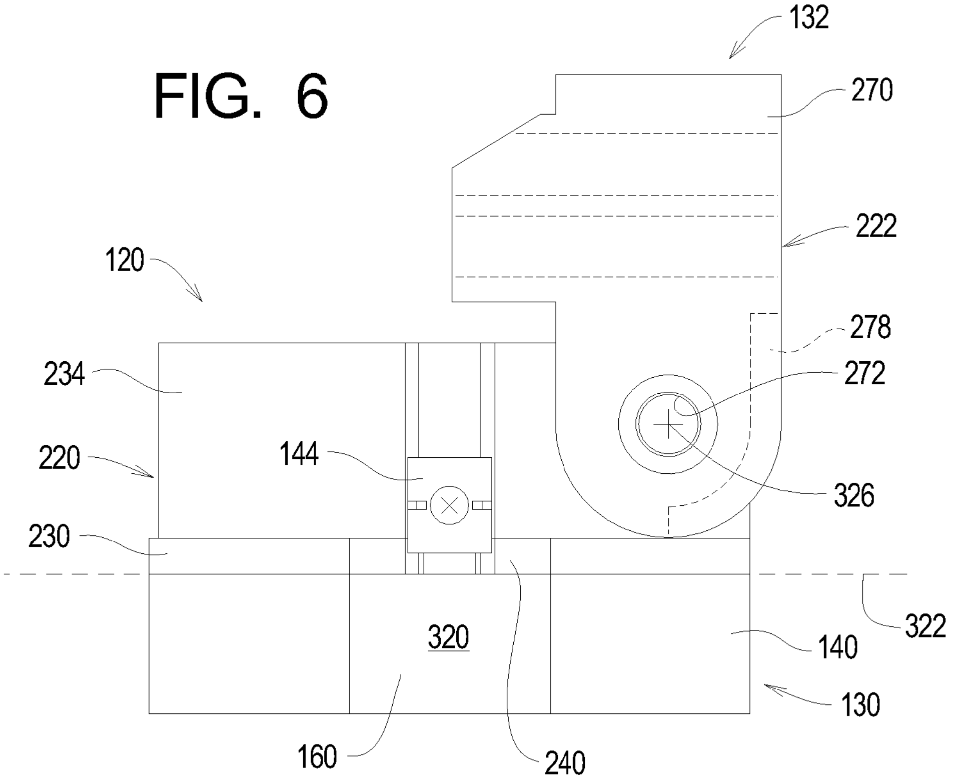

The clamp member 270 is then pivoted about the bolt axis 326 from the open position as shown in FIGS. 4 and 5 through an intermediate position as shown in FIG. 6 and into a closed position as shown in FIGS. 7-9. When the clamp member 270 is in the closed position, the cover wall portion 278 extends over and covers at least part of the shaft portion 286 of the bolt member 280 extending between the brace portion 232 and the clamp member 270.

The bolt member 280 is then axially rotated to displace the clamp member 270 towards the brace portion 232 from the unclamped position shown in FIG. 4 through an intermediate position as shown in FIG. 7 and into the clamped position as shown in FIG. 9. The bolt member 280 provides a mechanical advantage that allows the piercing points 152 and 154 of the piercing member 144 to pierce the insulator portion 82 and penetrate the conductor portion 80 of the conductor 70.

At this point, the piercing member 144 and contact plate 142 electrically connect the electrical portion 30 to the conductor portion 80 of the conductor 70. The piercing member 144 thus allows the electrical portion to detect a voltage signal associated with the conductor 70. Further, the electrical portion 30 contains a current transformer or the like (not shown) that is mounted within the main assembly 130 to detect a current signal associated with the conductor 70. In practice, a current transformer will be mounted in each of the tap assemblies 120 and 122. The detection of voltage and current signals by the electrical portion 30 is or may be conventional and will not be described herein in further detail. However, the present invention is of particular significance when the current sensing device is a variant of a Rogowski coil, and the example electrical portion 30 preferably employs a variant of a Rogowski coil.

The electrical portion 30 thus is capable of measuring and storing data values associated with the voltage and current signals and transferring these data values to a remote device such as the access device 50 at a later point in time. The first example measurement system 20 of the present invention thus integrates a non-contact current sensor and an insulation-piercing electrical contact with an electronic circuit for measurement, recording, time/date stamping, and communication for use on conductors in secondary voltage (typically 100-600 VAC) systems with a mechanism that automatically positions the tap assemblies 120 and 122 on the conductor or conductors being measured and which provides a controlled clamping force.

Figure 14:
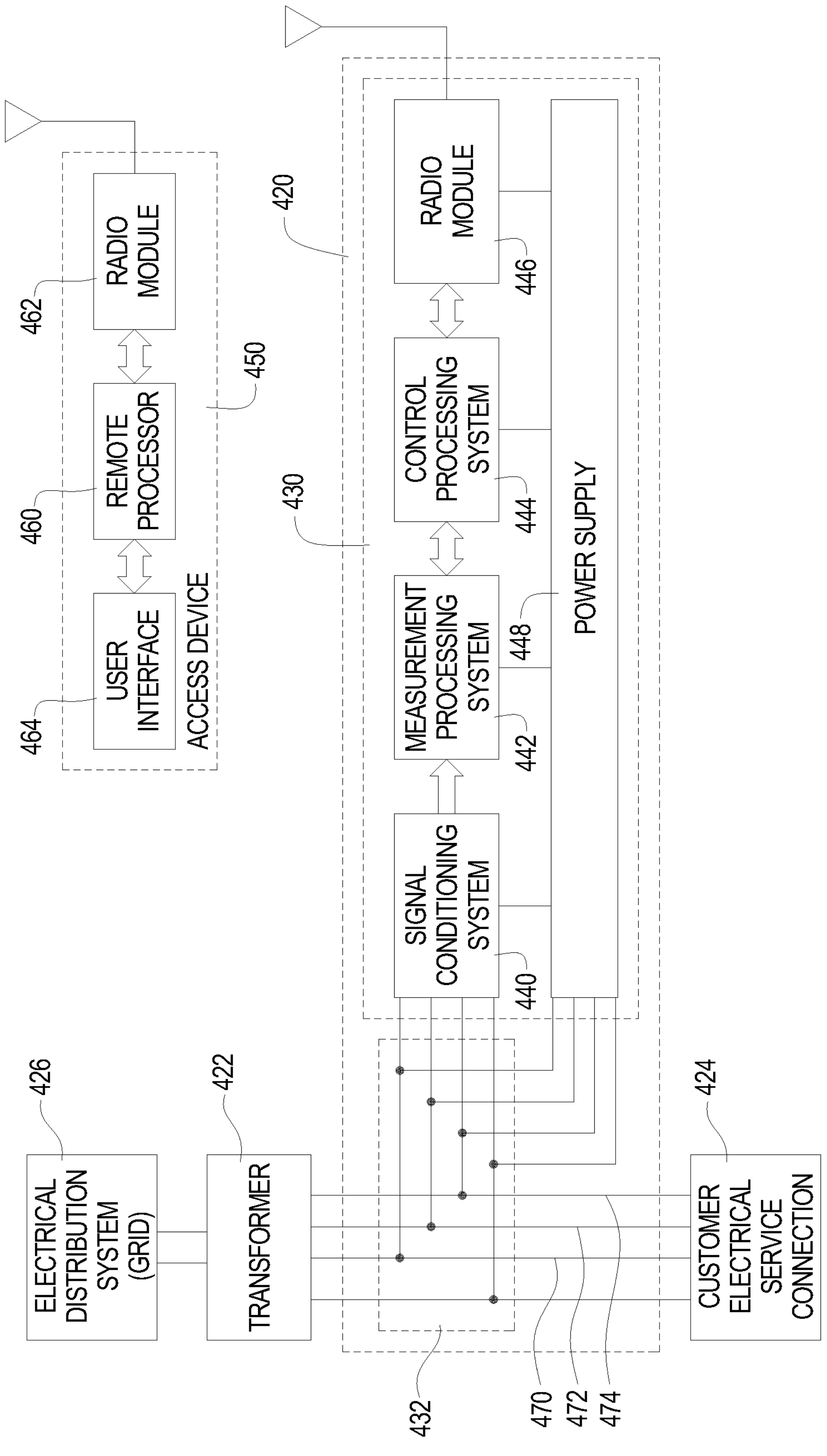
FIG. 14 is block diagram depicting an example of a second example measurement system of the present invention.
Figure 15:
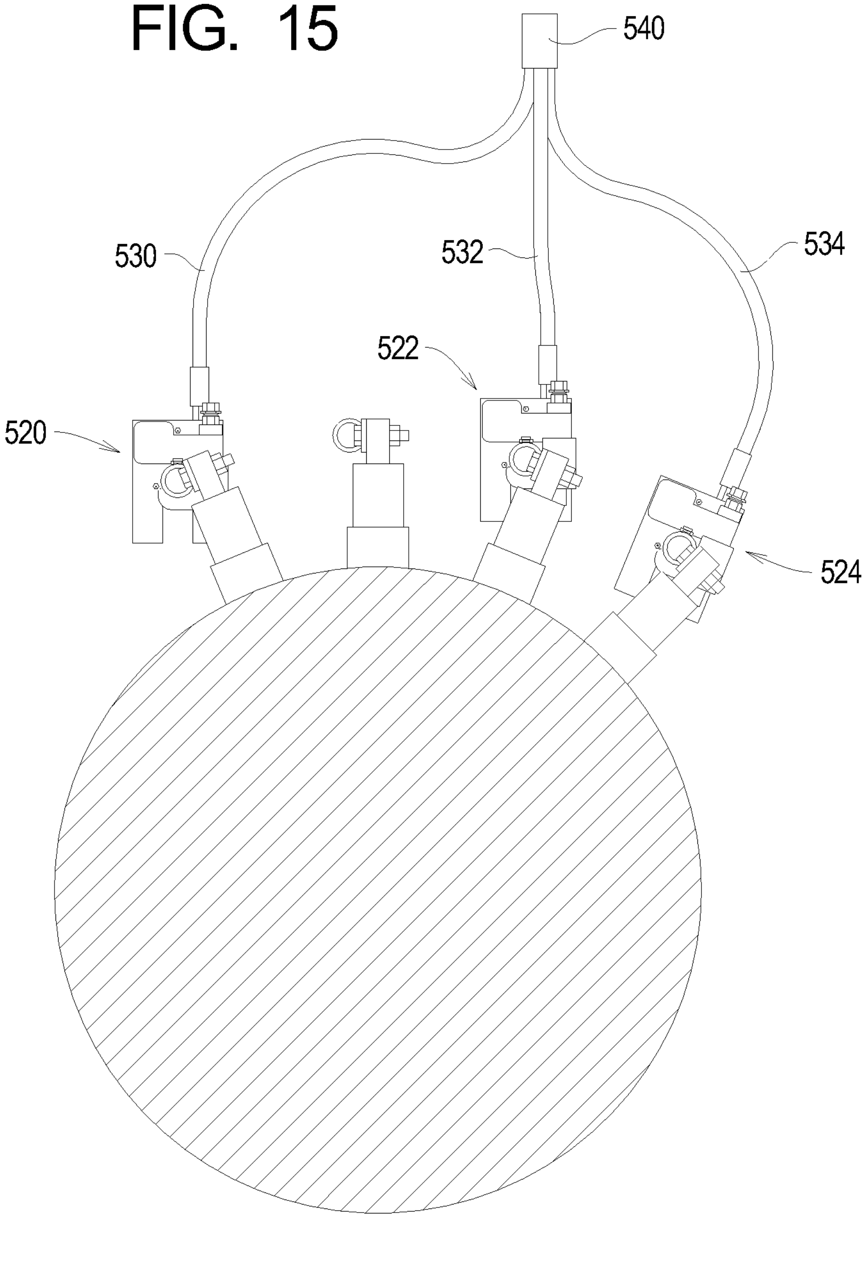
FIG. 15 is a top plan partial section view illustrating one example use of the second example measurement system with a second type of transformer.

Referring now to FIGS. 14 and 15 of the drawing, depicted therein is a second example measurement system 420 constructed in accordance with, and embodying, the principles of the present invention. The example measurement system 420 is connected between a transformer 422 and a customer electrical service connection 424. The transformer 422 and customer electrical service connection 424 are in turn connected to, and form a part of, an electrical distribution system 426. The transformer 422, customer electrical service connection 424, and electrical distribution system 426 are or may be conventional and will not be described herein beyond that extent helpful for a complete understanding of the present invention.

The second example measurement system 420 comprises an electrical portion 430 and a mechanical portion 432. The example electrical portion 430 is a circuit board or module comprising components that form a signal conditioning system 440, a measurement processing system 442, a control processing system 444, a radio module 446, and a power supply 448. The signal conditioning system 440 generates raw data based on analog signals associated with the electrical distribution system 426; the raw data is typically binary data suitable for processing by the measurement processing system 442. The control processing system 444 arranges the raw data as processed data and stores the processed data.

The control processing system 444 further runs an integrated software program incorporating the logic necessary to transmit the processed data to an access device 450 when directed. The control processing system 444 and the access device 450 communicate using the radio module 446, although the processed data may be directly downloaded from the control processing system 444 using an electrical connector (not shown) in a conventional fashion. The example access device 450 contains a remote processor 460, a radio module 462, and a user interface 464. The remote processor 460 runs a remote software program that cooperates with the integrate software program running on the control processing system 444 to transmit The power supply 448 supplies electrical power to the signal conditioning system 440, measurement processing system 442, control processing system 444, and radio module 446 as will be described in further detail below.

FIG. 14 further illustrates that, as is or may be conventional, first, second, and third conductors 470, 472, and 474 extend between the transformer 422 and the customer electrical service connection 424 in the example electrical distribution system 426. The example mechanical portion 432 connects the electrical portion 430 to the first, second, and third conductors 470, 472, and 474 as will be explained in further detail below. Like the example conductors 70 and 72 described above, the conductors 470, 472, 474 employ, or may employ, the same physical structure as described in further detail below. And like the example conductors 70 and 72 described above, the first, second, and third conductors 470, 472, and 474 each comprises a conductor portion and an insulator portion.

The mechanical portion 432 of the second example measurement system 420 is depicted in further detail in FIG. 15.

The example mechanical portion 432 comprises a first tap assembly 520, a second tap assembly 522, a third tap assembly 524, a first cable 530, a second cable 532, and a third cable 534. FIG. 15 further illustrates that the cables 530, 534, and 532 are connected at a connector structure 540.

The example tap assemblies 520, 522, 524 are or may be mechanically the same as each other, and any one of these tap assemblies 520, 522, and 524 may be the same as one or both of the tap assemblies 120 and 122 described above. The cables 530, 532, and 534 are interconnected to allow measurement of voltage signals as generally described above.

The electrical portion 430 of the measurement system 420 is mounted in any one or more of the tap assemblies 520, 522, and 524. In particular, the example electrical portion 430 is mounted within the first tap assembly 520, and the cables 530, 532, and 534 allow communication of analog signals from second and third tap assemblies 522 and 524 to the electrical portion 430 mounted within the first tap assembly 520. As an alternative example, only the measurement processing system 442, control system 444, and radio module 446 may be mounted within the first tap assembly 520. In this case, the signal conditioning system 440 may be arranged partly within the first tap assembly 520, partly within the second tap assembly 522, and partly within the third tap assembly 524. As yet another example, it may be possible to replicate the entire electrical portion 430 in each of the tap assemblies 520, 522, and 524, in which case the duplicated electrical portions 430 may each communicate directly with the access device 450 and with each other using the radio modules.

Like the first example measurement system 20 of the present invention, the second example measurement system 42 integrates a non-contact current sensor and an insulation-piercing electrical contact with an electronic circuit for measurement, recording, time/date stamping, and communication for use on conductors in secondary voltage (typically 100-600 VAC) systems with a mechanism that automatically positions the tap assemblies 520, 522, and 524 on the conductor or conductors being measured and which provides a controlled clamping force.

In the foregoing examples, the first and second example measurement systems 20 and 420 were described in the context of the insulated conductors 70, 72, 470, 472, and 474 that are typically suspended above-ground. The principles of the present invention may be applied to other types and uses of conductors, including uninsulated conductors, rigid conductors, and conductors located underground.

When applied to uninsulated conductors, the piercing member need only penetrate the conductor and need not pierce an insulator. The voltage contact thus is in direct contact with the conductor. The clamping mechanism otherwise operates as described above with respect to the tap assemblies described herein.

Rigid electrical connectors may form the conductor. Rigid electrical connectors may be insulated or uninsulated. In particular, some electrical equipment, such as transformers, employ rigid connectors, which may or may not be insulated, and the measurement systems of the present invention could be used directly on the connector rather than on the conductors attached to the connector.

In underground applications, the voltage contact and the flexible conductor, rigid connector, or other on which the measurement systems are connected may requires a water-tight seal. The measurement systems of the present invention as described above may be extended to such underground applications by using or incorporating any sealing components that may be required to form the water-tight seal.

What is claimed is:

1. A measurement device for generating measurement data associated with at least first and second conductors of an electrical distribution system comprising:

at least first and second tap assemblies each comprising a clamp assembly comprising a main housing, a clamp base is secured to the main housing, a brace defining a bolt opening, the brace is formed on the clamp base, a piercing member supported by the clamp base relative to the brace, a clamp member defining an anchor surface, and a bolt member defining a shaft portion and a head portion, where the shaft portion of the bolt member extends through the bolt opening and engages the anchor surface such that axial rotation of the bolt member displaces the clamp member towards and away from the piercing member; and at least one cable operatively connecting the first and second tap assemblies; whereby at least portions of the first and second conductors are arranged between the clamp member and the piercing member of the first and second tap assemblies, respectively, such that displacement of the clamp member of the first tap assembly towards the piercing member of the first tap assembly causes the piercing member of the first tap assembly to engage the first conductor, and displacement of the clamp member of the second tap assembly towards the piercing member of the second tap assembly causes the piercing member of the second tap assembly to engage the second conductor.

2. A measurement device as recited in claim 1, in which:

the shaft portion of the bolt member is externally threaded; and the anchor surface is internally threaded.

3. A measurement device as recited in claim 1, further comprising an electrical circuit operatively connected to the piercing members of the first and second tap assemblies.

4. A measurement device as recited in claim 1, further comprising an electrical circuit comprising a current sensor mounted in each of the first and second tap assemblies for sensing a current associated with the first and second conductors, respectively.

5. A measurement device as recited in claim 1, in which each of the first and second tap assemblies further comprises an anchor insert secured to the clamp member, where the anchor insert defines the anchor surface.

6. A measurement device as recited in claim 1, in which:

the first and second tap assemblies each define a clamp notch for receiving the first and second conductors, respectively; and the first and second tap assemblies each comprise a contact plate adjacent to the clamp notch; and the first and second tap assemblies each further comprises an attachment screw; whereby the piercing members are detachably attached to the contact plates using the attachment screws.

7. A measurement device as recited in claim 1, further comprising an electrical circuit, where the electrical circuit is:

operatively connected to the piercing members of the first and second tap assemblies; and comprises a current sensor mounted in each of the first and second tap assemblies for sensing a current associated with the first and second conductors, respectively.

8. A measurement device as recited in claim 7, in which the electrical circuit comprises a radio module for transmitting and receiving data.

9. A tap assembly for a measurement device for generating measurement data associated with at least one conductor of an electrical distribution system comprising:

a clamp base comprising a brace portion defining a bolt opening;

a main assembly comprising a contact plate;

a piercing member supported by the contact plate;

a clamp member defining an anchor surface; and a bolt member defining a shaft portion and a head portion; whereby the clamp base is attached to the main assembly to define a clamp notch, where the contact plate is adjacent to the clamp notch;

the shaft portion of the bolt member extends through the bolt opening and engages the anchor surface such that axial rotation of the bolt member displaces the clamp member towards and away from the piercing member; and at least a portion of the conductor is arranged within the clamp notch between the clamp member and the piercing member such that displacement of the clamp member towards the piercing member causes the piercing member to engage the conductor.

10. A tap assembly as recited in claim 9, in which:

the shaft portion of the bolt member is externally threaded; and the anchor surface is internally threaded.

11. A tap assembly as recited in claim 9, further comprising an electrical circuit operatively connected to the piercing member.

12. A tap assembly as recited in claim 9, further comprising an electrical circuit comprising a current sensor mounted at least partly within the main assembly.

13. A tap assembly as recited in claim 9, further comprising an anchor insert secured to the clamp member, where the anchor insert defines the anchor surface.

14. A tap assembly as recited in claim 9, further comprising an attachment screw, where the piercing member is detachably attached to the contact plate using the attachment screw.

15. A tap assembly as recited in claim 9, further comprising an electrical circuit, where the electrical circuit is:

operatively connected to the piercing member; and comprises a current sensor arranged to sense a current associated with the conductor.

16. A tap assembly as recited in claim 15, in which the electrical circuit comprises a radio module for transmitting and receiving data.

17. A method of generating measurement data associated with at least one conductor of an electrical distribution system, comprising the steps of:

providing a clamp base comprising a brace portion defining a bolt opening;

providing a main assembly comprising a contact plate;

supporting a piercing member supported on the contact plate;

providing a clamp member defining an anchor surface;

providing a bolt member defining a shaft portion and a head portion;

attaching the clamp base to the main assembly to define a clamp notch, where the contact plate is adjacent to the clamp notch;

extending the shaft portion of the bolt member through the bolt opening;

engaging the shaft portion of the bolt member with the anchor surface;

arranging at least a portion of the conductor within the clamp notch between the clamp member and the piercing member; and axially rotating the bolt member to displace the clamp member towards the piercing member to cause the piercing member to engage the conductor.

18. A method as recited in claim 17, further comprising the steps of:

operatively connecting an electrical circuit to the piercing member;

arranging a current sensor to sense a current associated with the conductor; and operatively connecting the electrical circuit to the current sensor.

19. A method as recited in claim 17, further comprising the step of detachably attaching the piercing member to the contact plate using an attachment screw.

* * * * *